(12) United States Patent
Singh et al.

(10) Patent No.: US 12,557,307 B2
(45) Date of Patent: Feb. 17, 2026

(54) METAL-INSULATOR-METAL (MIM) CAPACITOR WITH A TOP ELECTRODE HAVING AN OXYGEN-ENRICHED PORTION

(71) Applicant: TAIWAN SEMICONDUCTOR MANUFACTURING COMPANY, LTD., Hsinchu (TW)

(72) Inventors: Gulbagh Singh, Hsinchu (TW); Tsung-Han Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 663 days.

(21) Appl. No.: 17/590,359

(22) Filed: Feb. 1, 2022

(65) Prior Publication Data

US 2023/0011605 A1    Jan. 12, 2023

Related U.S. Application Data (60) Provisional application No. 63/220,257, filed on Jul. 9, 2021.

(51) Int. Cl.
| | | |
|---|---|---|
| *H10D 1/68* | (2025.01) | |
| *H01G 4/08* | (2006.01) | |
| *H01L 23/522* | (2006.01) | |
| *H10D 1/00* | (2025.01) | |

(52) U.S. Cl.
CPC ............... *H10D 1/694* (2025.01); *H01G 4/08* (2013.01); *H01L 23/5223* (2013.01); *H10D 1/042* (2025.01); *H10D 1/043* (2025.01); *H10D 1/696* (2025.01); *H10D 1/716* (2025.01)

(58) Field of Classification Search
CPC ... H01L 28/75; H01L 28/65; H01L 28/86–88; H01L 28/90–92; H01L 23/5223; H01L 21/02614; H01L 21/76856; H01L 21/76888; H01L 28/60; H01G 4/33; H10D 1/68; H10D 1/692–716; H10D 1/041–043
See application file for complete search history.

(56) References Cited

U.S. PATENT DOCUMENTS

| | | | |
|---|---|---|---|
| 8,445,991 B2 * | 5/2013 | Cho | H01L 21/31144 257/532 |
| 9,059,192 B2 * | 6/2015 | Lin | H01L 28/88 |
| 9,773,860 B1 * | 9/2017 | Lai | H01L 28/60 |

(Continued)

*Primary Examiner* — Younes Boulghassoul
(74) *Attorney, Agent, or Firm* — Hauptman Ham, LLP (57) ABSTRACT

A semiconductor device includes a first conductive material, a dielectric structure extending over a top surface of the first conductive material, the dielectric material having a first portion with a first thickness, and a second portion with a second thickness, and a third portion with a third thickness between the first thickness and the second thickness; and a second conductive material extending over the first portion of the dielectric structure. An oxygen-enriched portion of the second conductive material extends along a top surface and a sidewall of the second conductive material. A bottom surface and an interior portion of the second conductive material have an oxygen concentration which is larger than an oxygen concentration of a bottom surface and an interior portion of the second conductive material.

20 Claims, 8 Drawing Sheets

(56) References Cited

U.S. PATENT DOCUMENTS

| | | | |
|---|---|---|---|
| 2003/0008467 A1* | 1/2003 | Kai | H01L 21/31122 |
| | | | 257/E21.311 |
| 2005/0062130 A1* | 3/2005 | Ciancio | H01L 28/75 |
| | | | 257/532 |
| 2009/0020797 A1* | 1/2009 | Wang | H01L 28/56 |
| | | | 257/295 |
| 2018/0138263 A1* | 5/2018 | Lin | H01L 28/75 |
| 2019/0096986 A1* | 3/2019 | Hsu | H01L 28/91 |
| 2020/0006470 A1* | 1/2020 | Chang | H01G 2/10 |
| 2021/0057517 A1* | 2/2021 | Chen | H01L 28/60 |

* cited by examiner

METAL-INSULATOR-METAL (MIM) CAPACITOR WITH A TOP ELECTRODE HAVING AN OXYGEN-ENRICHED PORTION

PRIORITY

The present application claims the priority of U.S. Provisional Application No. 63/220,257, filed Jul. 9, 2021, which is incorporated herein by reference in its entirety.

BACKGROUND

Capacitors include conductive elements separated by insulating elements. In some approaches, etching of the capacitor results in forming a path for current leakage from a top conductive element of the capacitor. In some semiconductor devices, capacitors are used to regulate clock cycles and timing of circuit functions. In some semiconductor devices, capacitors are used as part of electrostatic discharge protection devices to reduce damage from large currents or high voltages experienced by the semiconductor devices. Regularity of clock cycles and timing of circuit functions is strongly related to the uniformity of the area of the capacitor electrode areas and the insulator thickness between capacitor electrodes. Electrostatic discharge protection is related to the number of capacitors and the current-storing capacity of capacitors in the electrostatic discharge protection structures of a semiconductor device.

DETAILED DESCRIPTION

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Manufacturing processes for semiconductor devices include steps to manufacture capacitors which result in structures where a top electrode of the capacitor and at least some dielectric material between the top electrode and a bottom electrode are etched to form a pillar structure. In some manufacturing processes, capacitor electrodes, or metal layers, are prone to corrosion during manufacturing processes as later deposited conductive materials react with trace contamination of cleaning solutions or chemicals used in etch processes. Corrosion of capacitor electrodes results in a greater likelihood that a capacitor will undergo failure because the corrosion promotes breaks in electrical connections between capacitors and elements of an interconnect structure. In the present disclosure, the likelihood of corrosion is reduced by depositing a protection layer over electrodes of a capacitor. Further, conductive material for some capacitor electrodes is treated in order to passivate the outer surface of the conductive material, which also lessens the likelihood of corrosion. Further, the protection layer and the passivated outer surface of the conductive material provide reduced likelihood of dielectric breakdown at the corners or edges of capacitor electrodes, the sites of the greatest likelihood of dielectric breakdown because the electrical field density is greatest at said sites. Some capacitors are manufactured with an insulator layer between the capacitor electrodes wherein the insulator layer comprises multiple films of dielectric material. By introducing multiple layers of different dielectric materials between the capacitor electrodes, dielectric breakdown across the insulator layer becomes less likely.

The present disclosure relates to a capacitor electrode for a semiconductor device which has a reduced likelihood of dielectric breakdown, and relates to a protection layer over the capacitor to reduce the likelihood of corrosion and dielectric breakdown.

Some embodiments of capacitors manufactured according to the present disclosure include an insulator layer comprising alternating layers of a first dielectric material and a second dielectric material. In some embodiments, a layer of one of the dielectric materials is partially trimmed or etched in order to form a pillar region in the insulator layer.

In some embodiments a covering layer is deposited over the top surface of the pillar region of the insulator layer, and over a base portion of the insulator layer over the capacitor bottom electrode. In some embodiments, the covering layer is in direct contact with the capacitor top electrode. In some embodiments, the covering layer comprises a same material as a first layer of dielectric material deposited over the capacitor bottom electrode. In some embodiments, the covering layer comprises a different material than the first layer of dielectric material deposited over the capacitor bottom electrode.

The top electrode includes a conductive material which is etched or trimmed to have a sidewall which aligns with the sidewall of the pillar base segment, or the conformal layer of a first dielectric material deposited thereon. The sidewall and the top surface of the top electrode is passivated by adding oxygen, fluorine, or nitrogen during, or after, the deposition of the top electrode material. In some embodiments, the capacitor top electrode and the capacitor bottom electrode comprise a same conductive material. In some embodiments, the capacitor top electrode and the capacitor bottom electrode comprise different conductive materials.

According to some embodiments of the present disclosure, a protection layer is deposited over the top surface of the top electrode, the sidewall of the top electrode, the sidewall of the first dielectric material trimmed into the pillar base segment, and a portion of the dielectric materials directly over the bottom electrode which extend beyond the sidewall of the pillar portion of the capacitor. In some embodiments, the protection layer includes an undoped silica glass (USG) layer, a silicon-based oxide, an insulating nitride layer such as silicon nitride, and an insulating carbide layer such as silicon carbide, or other suitable materials.

Figure 1:
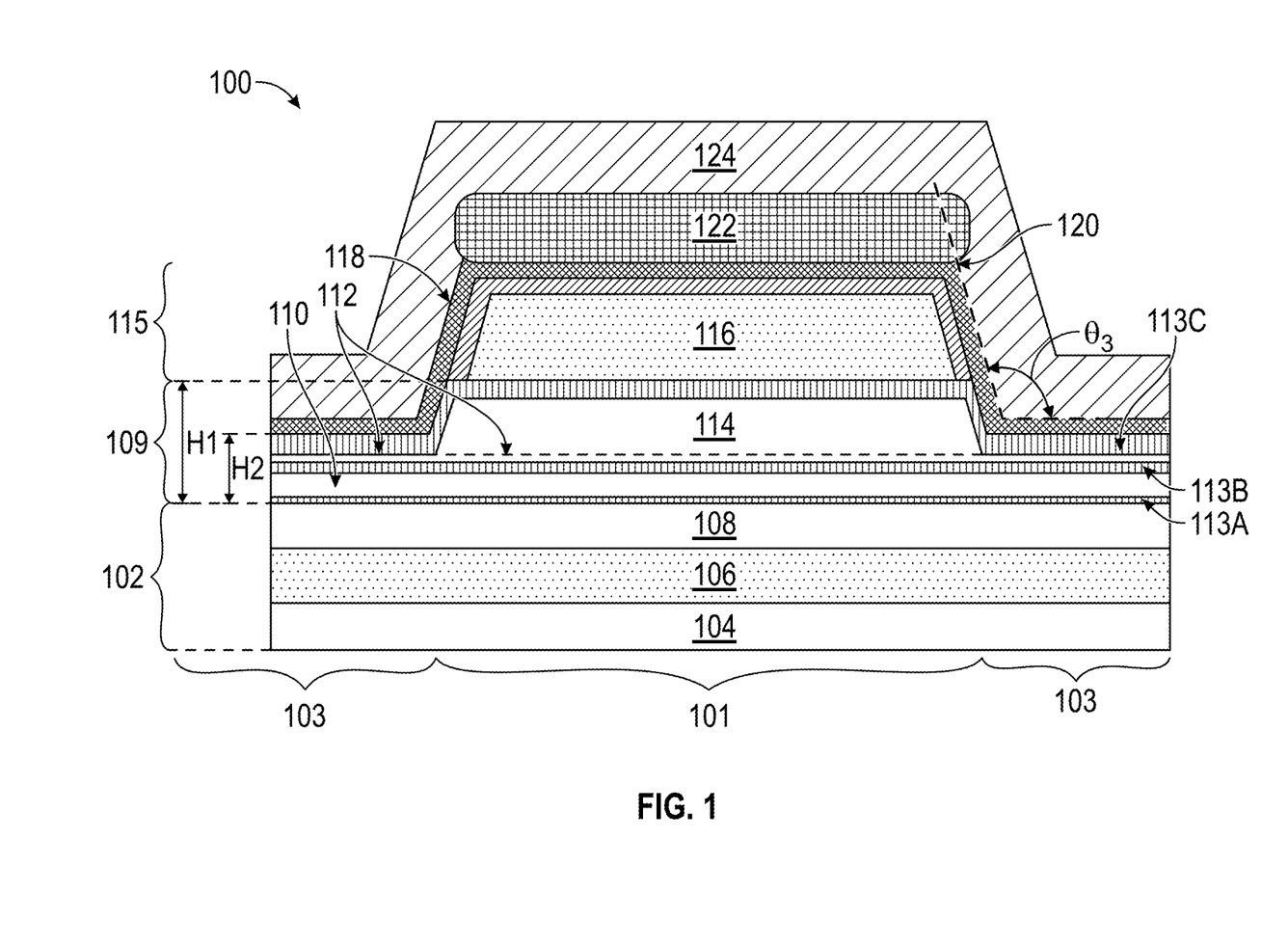
FIG. 1 is a cross-sectional view of a semiconductor device in accordance with some embodiments of the present disclosure.

FIG. 1 is a cross-sectional view of a semiconductor device 100 in accordance with some embodiments of the present disclosure. In semiconductor device 100, protective layers in the capacitor structure provide protection against dielectric breakdown between the capacitor electrodes and other semiconductor device elements, and also provide resistance against corrosion of the capacitor electrodes.

In semiconductor device 100, a capacitor bottom electrode 102 includes a first layer of conductive material 104, a second layer of conductive material 106, and a third layer of conductive material 108. In some embodiments, the first layer of conductive material 104 comprises a tantalum nitride the second layer of conductive material 106 comprises an alloy of aluminum and copper (AlCu), and the third layer of conductive material 108 comprises tantalum nitride. One of ordinary skill in the art would recognize that other conductive materials are also possible. In some embodiments, the capacitor bottom electrode 102 comprises two layers of conductive material. In some embodiments, the capacitor bottom electrode 102 comprises one layer of conductive material. In some embodiments, the capacitor bottom electrode 102 comprises greater than three layers of conductive material. According to some embodiments, the capacitor bottom electrode 102 comprises layers of aluminum, layers of copper, or other conductive materials associated with capacitors in integrated circuits.

In semiconductor device 100, dielectric material 113A comprises an insulating material which promotes adhesion between the capacitor bottom electrode 102 and dielectric material deposited over the dielectric material 113A. In some embodiments, dielectric material 113A comprises oxygen-enriched silicon nitride, or some other suitable dielectric material. In some embodiments, dielectric material 113A comprises oxygen-enriched silicon nitride or another suitable insulating material. A layer of dielectric material 110 is deposited over dielectric material 113A. In some embodiments, dielectric material 110 comprises silicon nitride or another suitable insulating material.

In semiconductor device 100, dielectric material 113B extends over a top surface of the layer of dielectric material 110. In some embodiments, dielectric material 113B comprises a layer of oxygen-enriched silicon nitride or another suitable insulating material. According to some embodiments, the oxygen found in dielectric material 113B is added during a deposition process. According to some embodiments, dielectric material 113B gains oxygen by an oxygen-enrichment or doping process after deposition of dielectric material 113B over dielectric material 110, wherein oxygen atoms from a plasma are accelerated towards the base layer of silicon nitride to enrich or doped the silicon nitride with oxygen.

In semiconductor device 100, a layer of dielectric material 112 extends over a top surface of dielectric material 113B. In semiconductor device 100, layer of dielectric material 112 comprises silicon nitride or another suitable insulating material. According to some embodiments, silicon nitride for dielectric material 112 is deposited by an atomic layer deposition (ALD) or a variety of chemical vapor deposition (CVD) such as plasma-enhanced uncle vapor deposition (PECVD).

In semiconductor device 100, dielectric material 114 is deposited over a top surface of dielectric material 112. Dielectric material 112 extends across a pillar region 101 and across a spacing region 103 either side of pillar region 101. Pillar region 101 corresponds to a location in a semiconductor device layout where a pillar structure for a capacitor is manufactured. Spacing region 103 at either side of region 101 corresponds to a portion of a semiconductor device which separates a capacitor, or the pillar thereof, from other elements of the semiconductor device. In some embodiments, spacing region 103 corresponds to a location in a semiconductor device layout where contacts to a capacitor are located in order to electrically connect a capacitor bottom electrode 102 to an interconnect structure in the semiconductor device.

According to some embodiments of a capacitor in a semiconductor device, the pillar region is circular, rectangular, ellipsoid, round, or square. In some embodiments, the spacing region extends around a perimeter or circumference of the pillar region.

In semiconductor device 100, layer of dielectric material 114 has been etched to conform to a perimeter of pillar region 101.

In semiconductor device 100, dielectric material 113C extends over a top surface of dielectric material 112 in the spacing region 103, and extends over sidewalls and a top surface of dielectric material 114 within the pillar region 101. According to some embodiments, dielectric material 113C comprises oxygen-enriched silicon nitride or another suitable insulating material. According to some embodiments, the oxygen-enriched silicon nitride layers of the dielectric structure have a same chemical composition, e.g., the same amount of oxygen enrichment. According to some embodiments, the oxygen-enriched silicon nitride beach layers of the dielectric structure have different chemical compositions, e.g., different amounts of oxygen enrichment.

In semiconductor device 100, the dielectric materials 110, 112, 114, and 113A-C have a combined thickness H1 within the pillar region 101. In semiconductor device 100, the dielectric materials 110, 112, and 113A-C have a combined thickness H2 within the spacing region 103. Further description of the structure and dimensions of a capacitor in a semiconductor device similar to semiconductor device 100, according to some embodiments, is provided below in the description of semiconductor device 300, and more specifically in the description of semiconductor device 300 in FIG. 3E. For example, in some embodiments, dielectric material 113A has a thickness of up to 15% of dimension H2, a thickness of the dielectric structure 109 between the bottom surface of the capacitor top electrode 115 and the top surface of the capacitor bottom electrode 102, as described herein. In some embodiments, dielectric material 113A is omitted from the semiconductor device, e.g., the dimension is 0% of the dimension H2. In some embodiments, the dielectric material 113B has a bottom surface at about 20% of the dimension H2 from the top surface of capacitor bottom electrode 102, and a top surface at not more than 60% of the dimension H2 from the top surface of capacitor bottom electrode 102. In some embodiments, the dielectric material 113C has a bottom surface at not less than 90% of the dimension H2 from the top surface of capacitor bottom electrode 102.

In semiconductor device 100, a capacitor top electrode 116 extends over a top surface of dielectric material 113C within pillar region 101 of the semiconductor device. A layer of treated conductive material 118 extends over sidewalls and a top surface of capacitor top electrode 116. According to some embodiments, capacitor top electrode 116 comprises a tantalum nitride. According to some embodiments, capacitor top electrode 116 comprises aluminum, copper, a copper aluminum alloy, or other conductive materials suitable for use in a semiconductor device capacitor. Treated conductive material 118 comprises an oxygen-enriched layer of the conductive material for capacitor top electrode 116.

A protection layer 120 extends over the pillar region 101 and the spacing region 103. Within pillar region 101, protection layer 120 extends over a top surface of the treated conductive material 118, the sidewalls of treated conductive material 118, and sidewalls of dielectric material 113C. In spacing region 103, protection layer 120 extends over a top surface of dielectric material 113C. In some embodiments, protection layer has a thickness of 200 Å±195 Å. For protection layer thicknesses smaller than 5 Å, protection layer 120 has an increased likelihood of irregular coverage and an associated increase in the likelihood of corrosion of the capacitor top electrode. For protection layer thicknesses larger than 395 Å, film delamination from the top surface and sidewalls of the treated conductive material (see treated conductive material 118) becomes more likely.

Hardmask 122 extends over a top surface of protection layer 120 within pillar region 101. In some embodiments, hardmask 122 comprises a silicon nitride layer. In some embodiments, hardmask 122 comprises a silicon carbide layer. In some embodiments, hardmask 122 comprises a polysilicon layer, or a layer of some other material which is resistant to an etch process for cap layer 124, as described below. In some embodiments, hardmask 122 has a thickness ranging from 20 nanometers (nm) to 200 nm. In some embodiments, hardmask 122 is configured to serve as an etch stop layer to facilitate manufacturing of an electrical connection to the capacitor top electrode 115.

A cap layer 124 extends over a top surface of hardmask 122 and over a top surface of protection layer 120 within pillar region 101, and over a top surface of protection layer 120 in the spacing region 103. In semiconductor device 100, protection layer 120 comprises a layer of USG dielectric material. In some embodiments, the protection layer comprises a silicon nitride layer, silicon dioxide, or some other suitable dielectric material. In some embodiments, the cap layer is deposited by an ALD process or a CVD process. In some embodiments, cap layer 124 is configured to provide electrical isolation for the capacitor top electrode 115 and the capacitor bottom electrode 102 of semiconductor device 100. In some embodiments, cap layer 124 is configured to reduce the likelihood of dielectric breakdown between one of the capacitor electrodes and the interconnect structure of the semiconductor device. According to some embodiments, cap layer 124 has a thickness ranging from 20 nm to 200 nm. For thicknesses of cap layer 124 smaller than about 20 nm, there is an increased likelihood of incomplete cap film coverage and/or short circuits between the capacitor top electrode and the vias or contacts to the capacitor bottom electrode. For thicknesses of cap layer 124 larger than 200 nm, there is an increased likelihood of the cap layer interfering with the etch process to form vias or contacts to the capacitor bottom electrode, e.g., uneven film etching because the cap layer extends out to some of the via locations.

Figure 2:
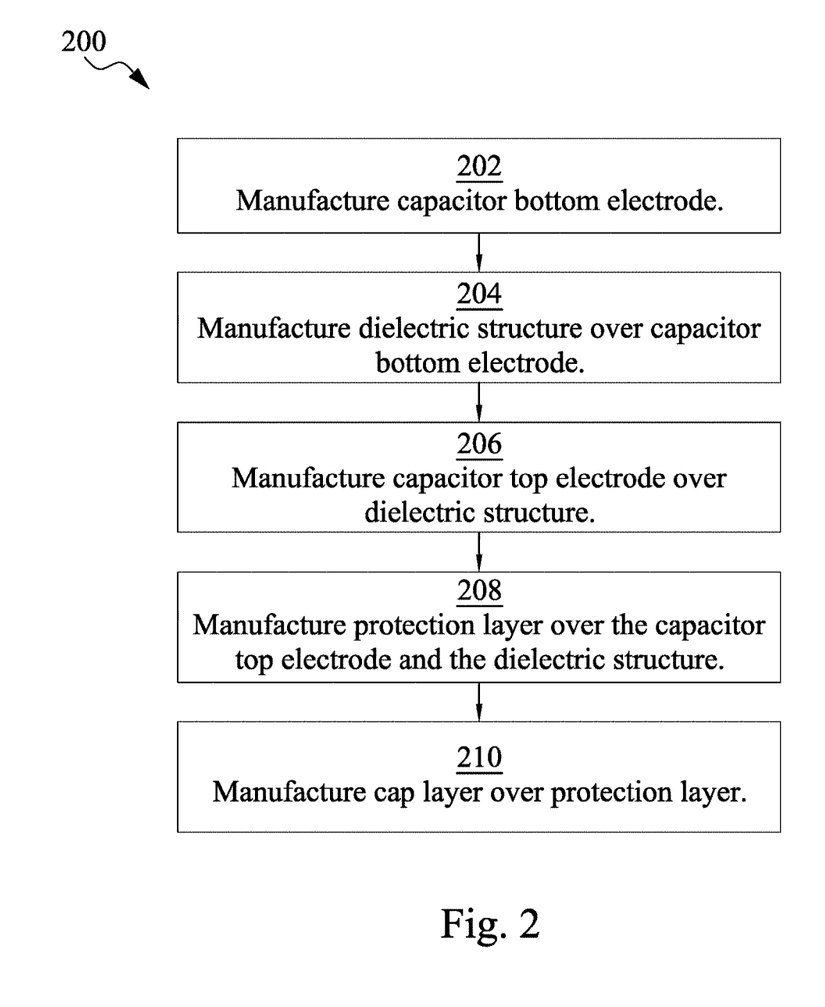
FIG. 2 is a flow diagram of a method of manufacturing a semiconductor device, in accordance with some embodiments.

FIG. 2 is a flow diagram of a method 200 of manufacturing a semiconductor device, in accordance with some embodiments.

Method 200 includes an operation 202, wherein a capacitor bottom electrode is manufactured. According to some embodiments, manufacturing a capacitor bottom electrode, such as capacitor bottom electrode 102 as described above in FIG. 1, includes depositing a single layer of conductive material in a spacing region and in a pillar region of the semiconductor device. According to some embodiments, manufacturing a capacitor bottom electrode includes depositing multiple layers of conductive material in the spacing region and the pillar region of the semiconductor device. According to some embodiments, layers of conductive material for the capacitor bottom electrode comprise tantalum, tantalum nitride, titanium, titanium nitride, cobalt, ruthenium, aluminum, copper, and alloys thereof, and other conductive materials compatible with a capacitor electrode in a semiconductor device. According to some embodiments, the capacitor bottom electrode is manufactured by performing a sputtering process from a sputtering target having a desired composition of a layer of the capacitor bottom electrode onto a substrate for the semiconductor device. According to some embodiments, the capacitor bottom electrode is manufactured by performing multiple sputtering processes from several targets having different compositions of conductive material therein. For example, in some embodiments, a capacitor bottom electrode is manufactured by sputtering a single layer of conductive material from a target comprising an alloy of aluminum and copper. Similarly, in some embodiments, a capacitor bottom electrode is manufactured by sputtering a first layer of conductive material from a titanium nitride target, a second layer from an aluminum and copper alloy target, and a third layer of conductive material from a tantalum nitride target. A person of ordinary skill will recognize that other arrangements of layers of conductive material are also suitable for forming capacitor bottom electrodes.

According to some embodiments, manufacturing a capacitor bottom electrode includes operations related to depositing a layer of masking material over the layer, or layers, of conductive material deposited for the capacitor bottom electrode. In some embodiments, the layer of masking material comprises a photoresist-type material. In some embodiments, the layer of masking material comprises a dielectric hardmask material, and a layer of patterning material deposited over the dielectric hardmask material. According so some embodiments, a pattern is transferred to the layer of masking material, and an etch process is performed to form discrete capacitor bottom electrodes for the semiconductor device. According to some embodiments of the present disclosure, the layer or layers of conductive material deposited for the capacitor bottom electrode, as described above, are etched by, e.g., a plasma etch process, into discrete portions, where each portion comprises a capacitor bottom electrode for the semiconductor device. According to some embodiments, the layer or layers of conductive material deposited for the capacitor bottom electrode, as described above, are etched by a liquid etch process, including, e.g., strong acid solution configured to dissolve the deposited conductive material for the capacitor bottom electrode.

Method 200 includes an operation 204, wherein a dielectric structure is manufactured over the capacitor bottom electrode. For example, non-limiting examples of a dielectric structure include dielectric structure 109 in semiconductor device 100, see FIG. 1, and dielectric structure 309 in semiconductor device 300, described below in discussion of FIG. 3B.

For purposes of clarity, the description of operation 204 given herein describes manufacturing operations for dielectric structure 109 in FIG. 1, above. A person of ordinary skill will recognize that the numbers of layers and the thicknesses of layers differ from the presentation given herein, in some embodiments, while still incorporating the relevant portions of the present disclosure.

Thus, operation 204 includes a first step wherein a first layer of dielectric material, see dielectric material 113A in semiconductor device 100 of FIG. 1, is deposited over a top surface of the capacitor bottom electrode. In some embodiments, the first layer of dielectric material is deposited by an ALD process or a CVD process. In some embodiments, the first layer of dielectric material comprises silicon nitride enriched with oxygen, or another suitable insulating material. In some embodiments, wherein the first layer comprises silicon nitride enriched with oxygen, the oxygen enrichment of the first layer of dielectric material is performed during deposition of the first layer of dielectric material, e.g., by doping the stream of deposition reactants with oxygen. In some embodiments, wherein the first layer comprises silicon nitride enriched with oxygen, the oxygen enrichment of the first layer of dielectric material is performed after deposition of the first layer of dielectric material, by adding oxygen atoms using an oxygen plasma and implanting the oxygen atoms into the first layer of dielectric material. In some embodiments, the first layer of dielectric material is configured to serve as an adhesion layer between the capacitor bottom electrode and the dielectric structure manufactured over the capacitor bottom electrode.

Referring to FIG. 1, as described above, dielectric structure 109 comprises five layers of dielectric material. In the present disclosure, layers of dielectric material in a dielectric structure comprise alternating layers of different dielectric materials, wherein the top-most layer of dielectric material comprises oxygen-enriched silicon nitride, see, e.g., dielectric material 113C of semiconductor device 100 (FIG. 1). In some embodiments, dielectric structure comprises four layers of dielectric material, with the top-most layer comprising oxygen-enriched silicon nitride, e.g., dielectric material 113C in semiconductor device 100 (FIG. 1). For purposes of clarity, the discussion of operation 204 provided below describes manufacturing of a dielectric structure wherein the dielectric structure comprises five layers of dielectric material, wherein the top-most layer of dielectric material comprises oxygen-enriched silicon nitride, as described in semiconductor device 100 (FIG. 1).

Operation 204 comprises a second step wherein a second layer of dielectric material, see dielectric material 110 in semiconductor device 100 (FIG. 1), is deposited over the capacitor bottom electrode. In some embodiments, the second layer of dielectric material comprises an untreated or unmodified layer of silicon nitride, or other suitable dielectric material. In some embodiments, the second layer of dielectric material is deposited by an ALD or a CVD process.

Operation 204 includes a third step wherein a third layer of dielectric material, see dielectric material 113B in semiconductor device 100 (FIG. 1), is deposited over the capacitor bottom electrode and the second layer of dielectric material. In some embodiments, the third layer of dielectric material comprises an oxygen-enriched layer of silicon nitride, or other suitable dielectric material. In some embodiments, the third layer of dielectric material is deposited according by an ALD or a CVD process, as described above regarding the deposition of the first layer of dielectric material. In some embodiments, the third layer of dielectric material is enriched according to one of the methods described above for the oxygen-enrichment of the first layer of dielectric material (e.g., simultaneous with the film deposition, or subsequent to film deposition by exposure to an oxygen plasma which embeds oxygen into the first layer of dielectric material).

Operation 204 includes a fourth step wherein a fourth layer of dielectric material, see dielectric material 112 in semiconductor device 100 (FIG. 1), is deposited over the capacitor bottom electrode and the third layer of dielectric material. In some embodiments, the second layer of dielectric material comprises an untreated or unmodified layer of silicon nitride, or other suitable dielectric material. In some embodiments, the fourth layer of dielectric material is deposited by an ALD or a CVD process. Operation 204 includes steps related to depositing a layer of patterning material over the fourth layer of dielectric material, transferring a pattern to the layer of patterning material, and etching the fourth layer of dielectric material to distinguish a pillar region from spacing regions of the semiconductor device, see pillar region 101 and spacing regions 103 of semiconductor device 100 (FIG. 1).

Operation 204 includes a fifth step wherein a fifth layer of dielectric material, see dielectric material 113C in semiconductor device 100 (FIG. 1), is deposited over the capacitor bottom electrode and the fourth layer of dielectric material. In some embodiments, the fifth layer of dielectric material comprises an oxygen-enriched layer of silicon nitride, or other suitable dielectric material. In some embodiments, the fifth layer of dielectric material is deposited according by an ALD or a CVD process, as described above regarding the deposition of the first layer of dielectric material. In some embodiments, the fifth layer of dielectric material is enriched according to one of the methods described above for the oxygen-enrichment of the first layer of dielectric material (e.g., simultaneous with the film deposition, or subsequent to film deposition by exposure to an oxygen plasma which embeds oxygen into the first layer of dielectric material). The fifth layer of dielectric material is deposited in a substantially conformal manner over the spacing regions and the pillar region of the semiconductor device, see FIG. 3E, below.

Method 200 includes an operation 206 wherein a capacitor top electrode is manufactured over the dielectric structure. For reference, see the non-limiting example provided above in the description of capacitor top electrode 115 of semiconductor device 100 (FIG. 1). According to some embodiments, manufacturing a capacitor top electrode includes steps related to depositing, using a sputtering process, a layer of conductive material over the dielectric structure in both the pillar region and spacing region, depositing a layer of patterning material over the layer of conductive material within the pillar region, and etching the layer of conductive material to expose a top surface the dielectric structure in the spacing regions, see spacing regions 103 of semiconductor device 100 (FIG. 1). According to some embodiments, the sputtering process used for manufacturing the capacitor top electrode comprises sputtering a titanium nitride layer from a titanium nitride target and over the dielectric structure. In some embodiments, the sputtering process comprises sputtering an aluminum copper (AlCu) target metal over the dielectric structure.

According to some embodiments, manufacturing a capacitor top electrode further includes steps associated with exposing a sidewall of the dielectric structure within the pillar region, see dielectric structure 309 in pillar region 301 (FIG. 3C), while maintaining coverage of the top surface of the dielectric structure within the pillar region of the semiconductor device.

According to some embodiments, patterning material deposited over the conductive material in the pillar region comprises photoresist or some other pattern transfer medium in semiconductor device manufacturing processes. According to some embodiments, pattern transfer is accomplished using photolithography, electron beam lithography, ultraviolet lithography, or helium ion lithography, or some other pattern transfer process used for semiconductor device manufacturing.

Figure 3A:
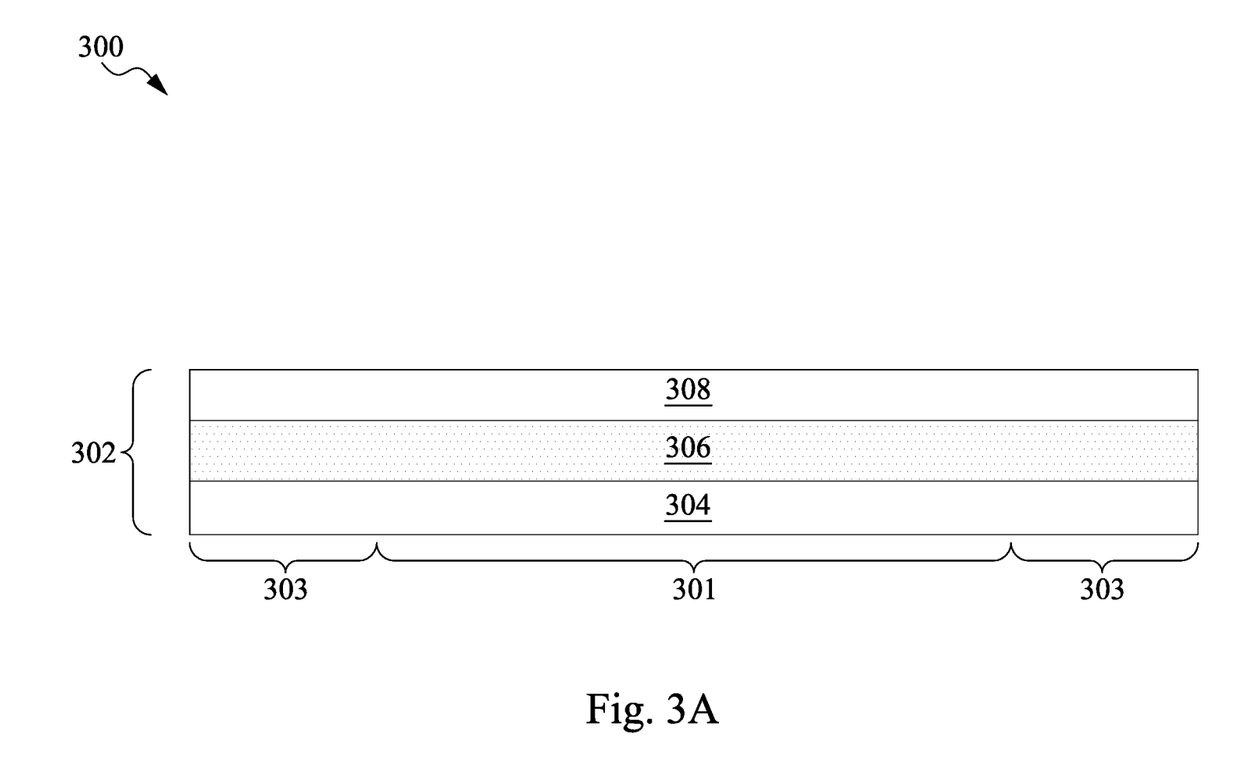
FIGS. 3A-3E are cross-sectional views of a semiconductor device during a manufacturing process, in accordance with some embodiments.
Figure 3B:
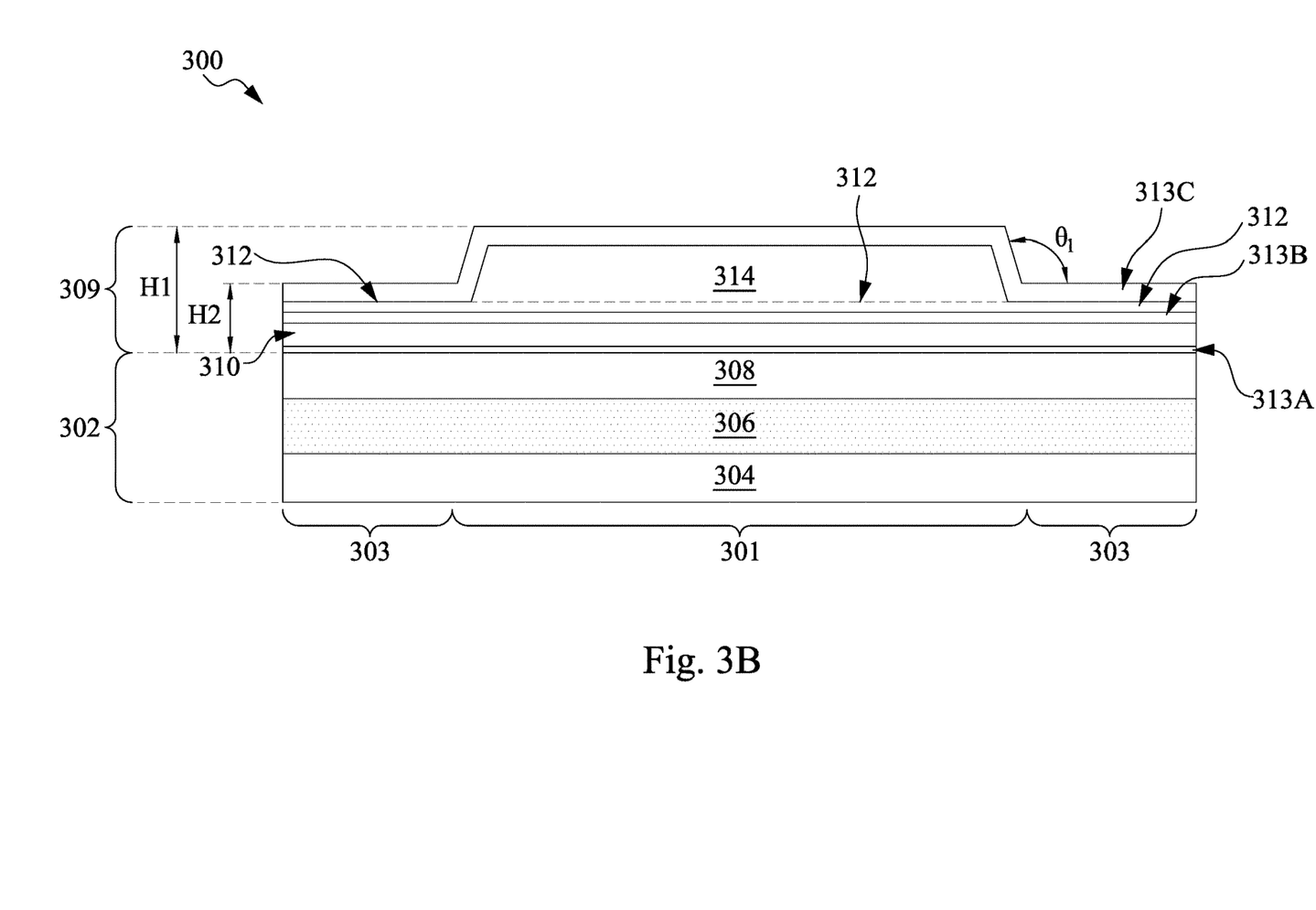
Figure 3C:
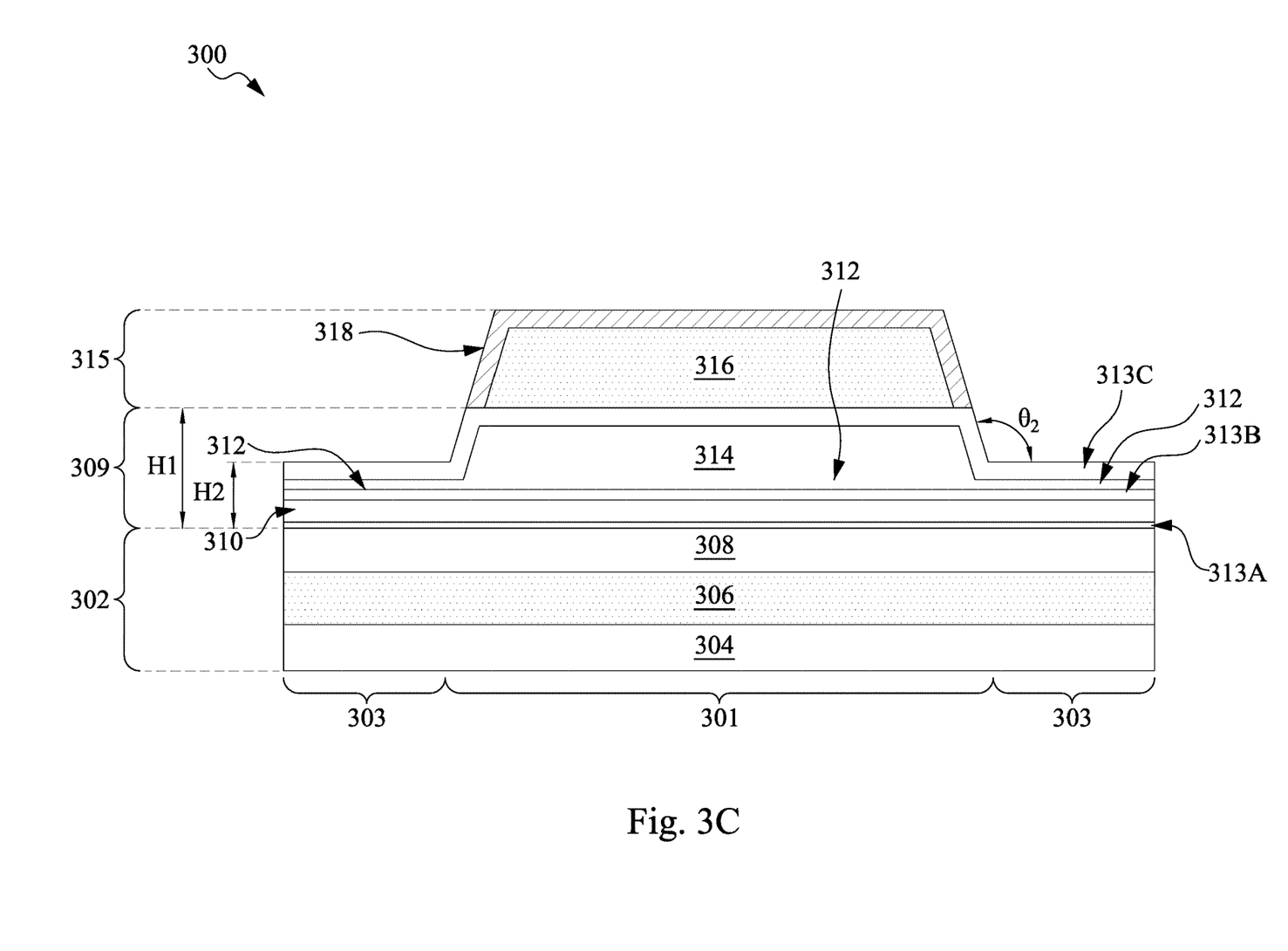

According to some embodiments, etching the layer of conductive material comprises performing a plasma etch process and/or a liquid etch process recess the layer of conductive material over the spacing region and exposes sidewalls of the dielectric structure, see dielectric structure 309 in pillar region 301 (FIG. 3C).

Figure 3D:
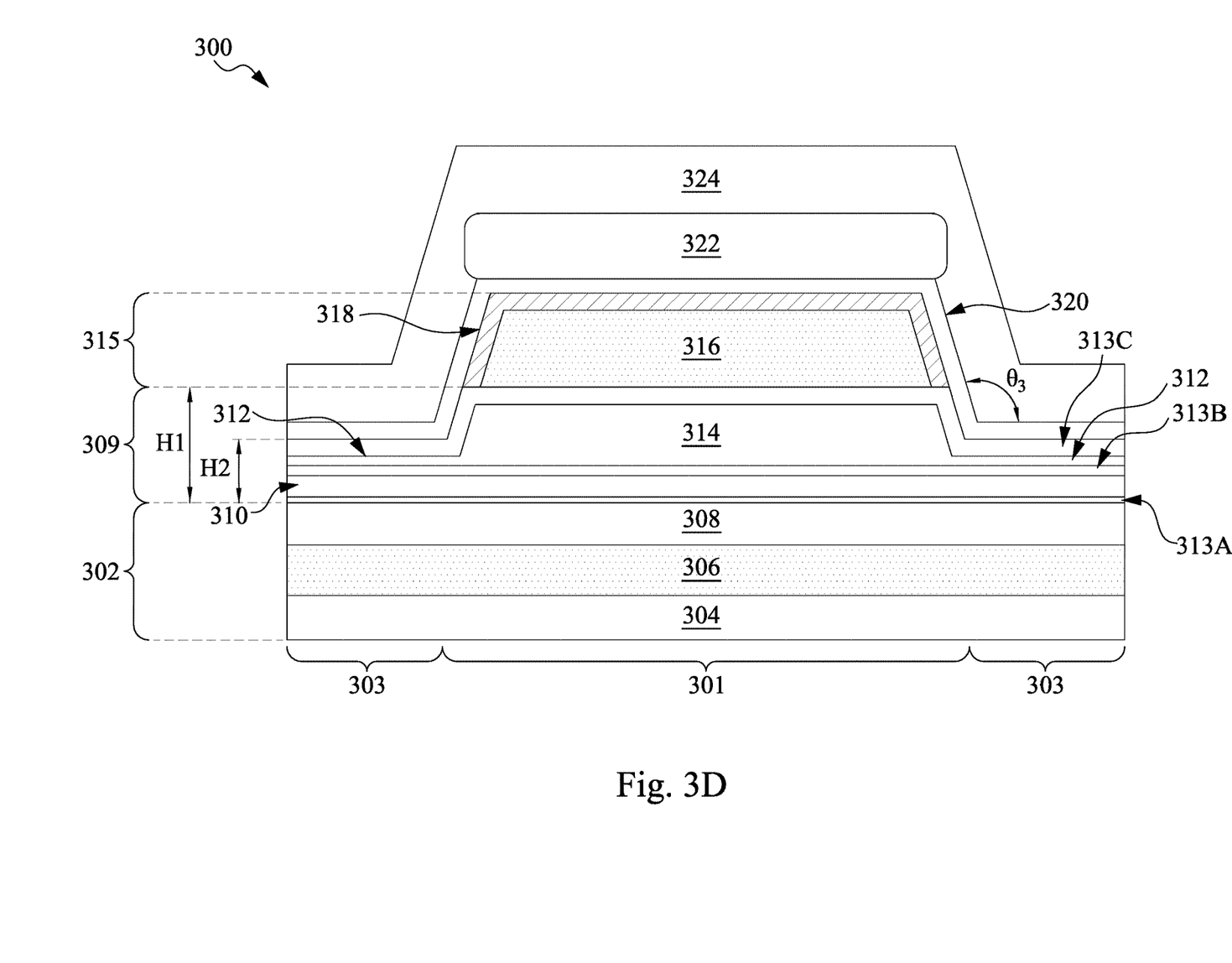

Operation 206 further includes steps associated with treating an exposed surface of the conductive material in the capacitor top electrode. Treating the exposed surface of the conductive material includes steps related to oxidizing the conductive material to form a passivation layer on the inductive material. In some embodiments, oxidizing the conductive material is performed by exposing the conductive material to an oxygen plasma. In some embodiments, oxidizing the conductive material is performed by exposing the conductive material to a flow of steam or heated water in a rapid thermal process (RTP) furnace. A non-limiting example of a treated conductive material formed by operation 206 includes treated conductive material 118 of semiconductor device 100 (FIG. 1), and treated conductive material 318 of semiconductor device 300 (FIG. 3D).

In some embodiments, the passivation layer reduces the likelihood of corrosion of the capacitor top electrode. For example, in a non-limiting embodiment, forming the passivation layer by controllably oxidizing an exposed surface of the capacitor top electrode results in an oxygen-enriched layer with consistent thickness across the sidewalls and top surface of the capacitor top electrode. Thus, the capacitor top electrode is less likely to undergo corrosion, including forming halide salts, during manufacturing. According to some embodiments, limiting the formation of corrosion of the capacitor top electrode promotes etch uniformity for vertical interconnects to the capacitor electrodes, and provides lower and/or more uniform contact resistance for electrical connections to the capacitor electrodes.

Method 200 includes an operation 208 wherein a protection layer is manufactured over the capacitor top electrode. In some embodiments, the protection layer is manufactured by an ALD process or a CVD process. Non-limiting examples of protection layers manufactured according to operation 208 include protection layer 120 in semiconductor device 100 (FIG. 1), and protection layer 320 of semiconductor device 300 (FIG. 3D).

According to some embodiments, a protection layer comprises a layer of dielectric material over a top surface of the capacitor top electrode and the dielectric structure. In some embodiments, the protection layer comprises silicon dioxide. In some embodiments, the protection layer comprises USG glass. In some embodiments, the protection layer comprises silicon nitride. In some embodiments, the protection layer comprises silicon oxy-nitride, or some other suitable dielectric material. In some embodiments, characteristics of a suitable dielectric material for a protection layer, such as protection layer 320 in semiconductor device 300 (FIG. 3D) include uniformity of film thickness across top surfaces and sidewalls of the pillar structure of a semiconductor device.

Thus, at a lower portion of the capacitor top electrode, there exists more than one insulating layers which physically and electrically isolate conductive material capacitor top electrode from corrosion sources and/or provide additional protection against dielectric breakdown between the capacitor top electrode and other circuit elements. In a non-limiting example, semiconductor device 100 includes protection layer 120 which covers the treated conductive material 118 extending over the top surface and the sidewalls of the capacitor top electrode 115 and the sidewalls of dielectric material 113C. Thus, the capacitor top electrode 115 is protected by two layers of corrosion-resisting dielectric materials, and by two layers of dielectric material at the bottom corners of the capacitor top electrode 115, which reduces the likelihood of breakdown of the dielectric material between the capacitor top electrode and the semiconductor device interconnect structure.

Method 200 includes operation 210, wherein a cap layer is manufactured over protection layer, see, for example, cap layer 324 in semiconductor device 300 (FIG. 3D). According to some embodiments, an optional hardmask, see, for example, hardmask 322 between cap layer 324 and protection layer 320 in semiconductor device 300 (FIG. 3D), is manufactured directly over a top surface of the protection layer within the pillar region 101. According to some embodiments, a conformal layer of hardmask material is deposited over the protection layer using, for example, CVD or ALD, a layer of patterning material is deposited over the hardmask material, and a pattern is transferred to the layer of patterning material such that the hardmask material is exposed within openings in the layer of patterning material over the spacing region. An etch process is performed in order to remove the hardmask outside of the pillar region and to expose the top surface of the protection layer in the spacing region. Thus, a remaining portion of the hardmask material extends over a top surface of the protection layer and the top surface of the capacitor top electrode within the pillar region. In some embodiments, a portion of the hardmask material extends along the protection layer along sidewalls of the capacitor top electrode. According to some embodiments, the hardmask material comprises silicon dioxide, silicon nitride, silicon carbide, or other hardmask materials compatible with a capacitor manufacturing scheme for a semiconductor device.

According to some embodiments, the cap layer is deposited over a top surface of the hardmask and over the protection layer in both the pillar region and the spacing region of the semiconductor device, see, for example, cap layer 324 and hardmask 322 in semiconductor device 300 (FIG. 3D). According to some embodiments, the cap layer comprises an insulating material such as an oxide. In some embodiments, the cap layer comprises silicon dioxide or some other non-metallic oxide. In some embodiments, the cap layer comprises a conformal layer extending over the pillar region and the spacing region. According to some embodiments, the cap layer is deposited by CVD or ALD processes, as described above.

FIGS. 3A-3E are cross-sectional views of a semiconductor device 300 during a manufacturing process, in accordance with some embodiments. The manufacturing process followed corresponds to method 200 described above by the flow diagram in FIG. 2.

In FIG. 3A, semiconductor device 300 comprises a capacitor bottom electrode 302. In method 200, manufacturing a capacitor bottom electrode is described in operation 202. Capacitor bottom electrode 302 comprises a first layer of conductive material 304, a second layer of conductive material 306 which extends over first layer of conductive material 304, and a third layer of conductive material 308, which extends over a top surface of second layer of conductive material 306. In semiconductor device 300, first layer of conductive material 304 comprises a tantalum nitride (TaN), second layer of conductive material 306 comprises an aluminum-copper alloy (AlCu), and the layer of conductive material 308 comprises a tantalum nitride.

According to some embodiments, as described above semiconductor device 100, some embodiments of a capacitor bottom electrode comprise different numbers of layers of conductive material and described herein. For example, in a non-limiting embodiment of the present disclosure, a capacitor bottom electrode comprises a single layer of conductive material, e.g., tantalum nitride, aluminum copper alloy, and so forth.

In FIG. 3B, semiconductor device 300 comprises capacitor bottom electrode 302 and a dielectric structure 309. In method 200, manufacturing a dielectric structure is described in operation 204. In a pillar region 301 of semiconductor device 300, dielectric structure 309 has a dimension H1, and in a spacing region 303 of semiconductor device 300, dielectric structure 309 has a dimension H2 smaller than dimension H1. In semiconductor device 300, a dimension H2 corresponds to the thickness of dielectric materials 113A-C, and dielectric materials 110 and 112. A portion of the dielectric structure at the border or perimeter of the pillar region, and against the spacing region, has a sloped or angled sidewall with variable or decreasing thickness as the sidewall approaches the spacing region from a center portion of the pillar region.

Dielectric structure 309 comprises a layer of dielectric material 313A which extends from spacing region 303 at one side of pillar region 3012 spacing region 303 and an opposite side of pillar region 301. Similarly, dielectric material 310, dielectric material 313B, and dielectric material 312 extend from spacing region 30 outside of the pillar region 3012 spacing region 303 and an opposite side of pillar region 301. According to some embodiments, dielectric material 313A and 313B are a first type of dielectric material, and dielectric material 310 and dielectric material 312 are a second type of dielectric material. According to some embodiments, dielectric material 314 and dielectric materials 310 and 312 are the second type of dielectric material.

Dielectric material 313C extends over a top surface of dielectric material 312 in the spacing region 303 at opposite sides of pillar region 301, and extends over a sidewall and the top surface of dielectric material 314 in pillar region 301. Dielectric material 313C has a sidewall angle θ1 measured from a top surface of dielectric material 313C in spacing region 303 and a top surface of dielectric material 313C extending over a sidewall of dielectric material 314 in pillar region 301. In some embodiments, $\theta 1 > 90°$. In some embodiments, $\theta 1 \leq 120°$. For values of $\theta 1 \leq 90°$, the deposition of the dielectric material 313C on the sidewall of dielectric material 314 becomes difficult. For values of $\theta 1 > 120°$, the spacing of the capacitor increases to crowd other circuit elements, and the spacing between vias or vertical interconnects to the capacitor bottom electrode are crowded, which increases the likelihood of manufacturing defects. In other words, the sidewalls of dielectric material 314, and dielectric material 31C3 extending over sidewalls and a top surface of dielectric material 314, taper towards a center portion of dielectric material 314 with increasing distance from conductive material 308.

According to some embodiments, the taper of dielectric material 314 is induced by an etch process as described above in operation 204 of method 200. Accordingly, dielectric material 314 has a sloped surface with an angle θ2. In some embodiments, $90° < \theta 2 \leq 120°$. For values of $\theta 2 \leq 90°$, deposition of dielectric material 113C is more likely to be uneven, increasing the likelihood of dielectric breakdown across dielectric structure 309 between the capacitor top electrode 315, as described below, and the capacitor bottom electrode 302. For values of $\theta 2 > 120°$, the area of the capacitor top electrode, combined with the lateral dimensions of the sloped sidewall of the dielectric structure in a pillar region such as pillar region 301, increases the likelihood of manufacturing errors related to forming contacts to the capacitor bottom electrode because of space constraints or crowding, and/or needlessly increases the area of the die whereon the semiconductor device is being manufactured. In some embodiments, θ1 and θ2 are substantially similar, e.g. $\theta 2 = \theta 1 \pm 5°$. For values of θ2 which are not substantially similar to θ1, the uniformity of the thickness of the top-most layer of dielectric material and the dimensions H1 and H2 are increasingly likely to be outside of a manufacturing specification for the semiconductor device. According to some embodiments, deposition of dielectric material 313C is also described in the description of operation 204 of method 200.

In FIG. 3C, semiconductor device 300 comprises a capacitor bottom electrode 302, a dielectric structure 309, and a capacitor top electrode 315, as described below. In method 200, manufacturing of a capacitor top electrode is described in operation 206. Capacitor top electrode 315 comprises a portion of conductive material 316 and a layer of treated conductive material 318 which extends over sidewalls and a top surface of conductive material 316.

According to some embodiments, conductive material 316 comprises a tantalum nitride. According to some embodiments, conductive material 316 comprises an aluminum copper alloy, or some other conductive materials compatible with the manufacture of a capacitor in a semiconductor device such as aluminum, copper, cobalt, tungsten, nickel, titanium, and so forth.

In semiconductor device 300, treated conductive material 318 comprises oxygen-enriched tantalum nitride. A relevant aspect of the selection of the material for capacitor top electrode 315 is the readiness with which the conductive material oxidizes, and the character of the oxidized conductive material or treated conductive material. For example, a treated conductive material which undergoes significant expansion is more likely to extend beyond a sidewall of dielectric material 313C and result in the formation of a void upon deposition of a protective material over the capacitor top electrode 315. In another aspect of the selection of the conductive material for capacitor top electrode 315 is the ability of treated conductive material to reduce corruption during handling in a manufacturing process before a protective layer is deposited over the capacitor top electrode.

In FIG. 3D, semiconductor device 300 comprises capacitor bottom electrode 302, dielectric structure 309, capacitor top electrode 315, a protection layer 320 extending over a top surface of the dielectric structure in spacing region 303 and a top surface of the capacitor top electrode in pillar region 301. In method 200, manufacturing of a protection layer such as protection layer 320 is described in operation 208. In method 200, manufacturing of a hardmask such as hardmask 322 and a cap layer such as cap layer 324 is described in operation 210. A hardmask 322 extends over a top surface of the capacitor top electrode is region 301, such that the protection layer 320 separates treated conductive material 318 of the capacitor top electrode 315 from hardmask 322. A cap layer 324 extends over the exposed portions of the protection layer 320 and over the hardmask 322.

A sidewall angle θ3 for protection layer 320 is measured from a top surface of protection layer 320 in pillar region 301 and a top surface of protection layer 320 in spacing region 303. Sidewall angle θ3 is greater than 90° and θ3 is substantially similar to θ2, e.g., θ3=θ2±5°. For values of θ3 which are not substantially similar to θ2, the thickness of the top-most layer of dielectric material is likely outside of a thickness specification because of issues related to etching the capacitor top electrode. In some embodiments, film thickness is non-uniform across a wafer during a manufacturing process. In semiconductor devices wherein a film thickness is non-uniform, the process of etching contact or via openings to electrically connect to a conductive element in a semiconductor device, such as a capacitor top electrode, becomes increasingly difficult. In some embodiments, the difficulty relates to over-etching, e.g., forming an opening which extends into the conductive element, and increasing the likelihood of short circuits between electrical connections. In some embodiments, the difficulty relates to under-etching, where an opening through dielectric material is insufficiently cleared, resulting in increased contact resistance. Thus, the capacitance of the capacitor has a greater likelihood of falling outside of a manufacturing specification for the semiconductor device 300.

Figure 3E:
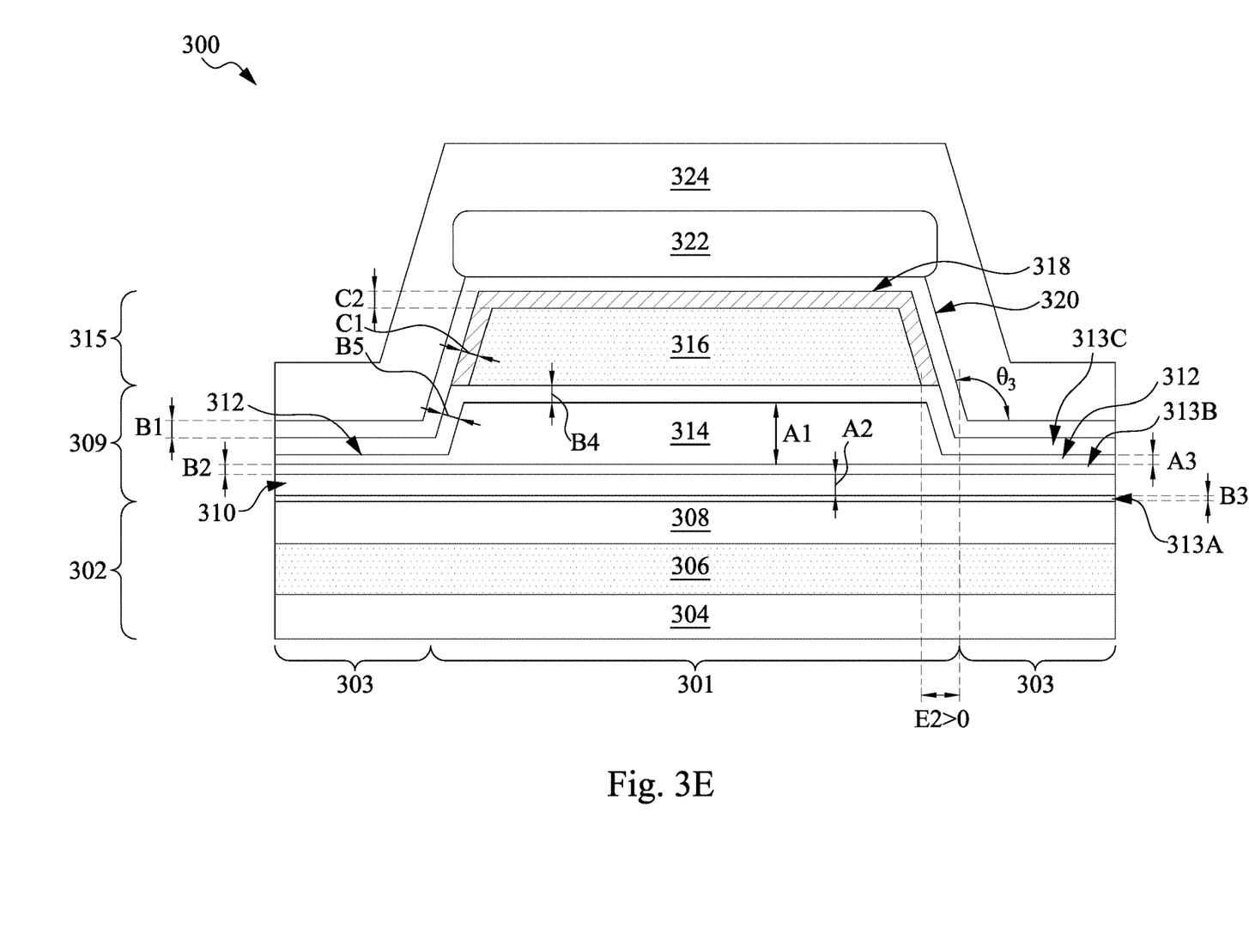

In FIG. 3E, measurements of dimensions of semiconductor device 300 are provided for clarity.

In semiconductor device 300, dimension A1 corresponds to a combined thickness of dielectric material 314 and dielectric material 312 in pillar region 301. Dimension A2 refers to the thickness of dielectric material 310 in pillar region 301 and spacing region 303 between dielectric material 313A and dielectric material 313B. Dimension A3 refers to the thickness of dielectric material 312 in spacing region 303 between dielectric material 313B and dielectric material 313C. Dielectric material 310, dielectric material 312, and dielectric material 314 are manufactured according to the steps described above for operation 204 of method 200. Regarding the dimensions A1-A3 of the non-oxygen-enriched dielectric material, film, dimension A1≥A2, and dimension A1≥A3>0.

According to some embodiments, dimension A1 ranges from around 50 nm to around 200 nm. For values of dimension A1 smaller than about 50 nm, the coverage of the dielectric material in the spacing region becomes thin and more prone to dielectric breakdown. For values of dimension A1 larger than about 200 nm, the capacitance of the capacitor in semiconductor device 300 is more likely to fall below a manufacturing specification for the semiconductor device. According to some embodiments, dimension A2 ranges from about 20 nm to about 50 nm. For values of dimension A2 smaller than about 20 nm, the adhesion of dielectric material 313B to dielectric material 310 is more likely to decrease and the dielectric materials are more likely to delaminate. For values of dimension A2 larger than about 50 nm, the capacitance of semiconductor device 300 is more likely to fall below a manufacturing specification of the semiconductor device. In semiconductor device 300, dimension A3 ranges from about 20 nm to about 50 nm. For values of dimension A3 smaller than about 20 nm, the dielectric material 313C, and/or dielectric material 312 are more prone to delamination during manufacturing. For values of dimension A3 larger than about 50 nm, the amount of sidewall protection for the pillar region 301 is more likely to result in dielectric breakdown and premature device failure.

In semiconductor device 300: dimension B1 corresponds to the thickness of dielectric material 313C in spacing region 303; dimension B4 corresponds to the thickness of dielectric material 313C in pillar region 301 between dielectric material 314 and conductive material 316; and dimension B5 corresponds to the thickness of dielectric material 313C between dielectric material 314 and protection layer 320. Dimension B2 corresponds to the thickness of dielectric material 313B between dielectric material 310 and dielectric material 312. Dimension B3 corresponds to the film thickness of dielectric material 313A between dielectric material 310 and capacitor bottom electrode 302. Dielectric materials 313A, 313B, and 313C are manufactured according to steps described above in operation 204 of method 200. Regarding dimensions B1, B2, B3, B4, and B5: In some embodiments, dimension B3≤B2; in some embodiments, dimension B2≤B1; in some embodiments, dimension B4≤B1; in some embodiments, dimensions B2, B3, and B4 are comparable; in some embodiments, dimension B5≥B1; and in some embodiments, dimension B5≤B1.

According to some embodiments, dimension B1 ranges from about 20 nm to about 50 nm. For values of dimension B1 smaller than about 20 nm, there is an increased likelihood of incomplete film coverage or non-uniform film thickness in the spacing region 303. For values of dimension B1 larger than about 50 nm, there is an increased likelihood that the sidewall angle θ3 at the corner of the protection layer, e.g., protection layer 320 in semiconductor device 300 (FIG. 3E) will be rounded or bow outward into the spacing region 303, interfering with vertical interconnects with the capacitor bottom electrode 302. According to some embodiments, dimension B4 ranges from about 20 nm to about 50 nm. For values of dimension B4 larger than about 50 nm, the capacitance of the capacitor is more likely to fall below a manufacturing specification. For values of dimension smaller than about 20 nm, there is an increased likelihood of incomplete film coverage and/or non-uniform film thickness, which adversely impacts capacitance uniformity in the semiconductor device. According to some embodiments, dimension B5 ranges from about 15 nm to about 40 nm. For values of dimension B5 smaller than 15 nm, there is an increased likelihood of dielectric breakdown between capacitor top electrode 315 and capacitor bottom electrode 302. For values of dimension B5 larger than 40 nm, there is an increased likelihood of rounding in the protection layer, e.g., protection layer 320 of semiconductor device 300 (FIG. 3E), making θ3 larger and leading to uneven etch of the contacts or vias to capacitor bottom electrode 302. In some embodiments, dimension B2 ranges from about 20 nm to about 50 nm. For values of dimension B2 smaller than about 20 nm, the dielectric material 313B and/or dielectric material 312 is more likely to delaminate and produce defects. For values of dimension B2 larger than about 50 nm, the dielectric material 313B is more likely to reduce the capacitance of the capacitor in semiconductor device 300. In some embodiments, dimension B3 has a value ranging from 0 nm to about 20 nm, e.g., in some embodiments, dielectric material 313A is omitted from semiconductor device 300. In semiconductor device 300, dielectric material 313A is included in order to promote adhesion of dielectric material 310 to capacitor bottom electrode 302. For values of dimension B3 larger than about 20 nm, the adhesion-promoting benefits of dielectric material 313 cease increasing, and the capacitance of the capacitor in semiconductor device 300 begins to decrease.

In semiconductor device 300, dimension C1 refers to the thickness of a sidewall portion of treated conductive material 318 and dimension C2 refers to the thickness of a top surface portion of treated conductive material 318. Treated conductive material 318 is manufactured according to steps described in operation 206 of method 200. In some embodiments, dimension C1≥C2. In some embodiments, sidewall angles θ1, θ2, and θ3 are greater than 90°.

In some embodiments, dimension C1 ranges from about 30 nm to about 50 nm. For values of dimension C1 smaller than about 30 nm, there is an increased likelihood of corrosion and dielectric breakdown between capacitor top electrode 315 and capacitor bottom electrode 302. For values of dimension C1 larger than about 50 nm, the area of the capacitor top electrode 315 decreases sufficiently to reduce the capacitance in semiconductor device 300 by reducing the capacitor top electrode area. According to some embodiments, dimension C2 ranges from about 30 nm to about 50 nm. For values of dimension C2 smaller than about 30 nm, there is an elevated likelihood of incomplete coverage of the treated insulating layer over the capacitor top electrode 315. For values of dimension C2 larger than about 50 nm, there is an increased difficulty, e.g., etch time, cleaning difficulty, in manufacturing the electrical connections to the capacitor top electrode 315, without additional protection from corrosion of the capacitor top electrode 315.

Aspects of the present disclosure relate to a semiconductor device which comprises a first conductive material; a dielectric structure extending over a top surface of the first conductive material, the dielectric structure having a first portion with a first thickness, and a second portion with a second thickness, and a third portion with a third thickness between the first thickness and the second thickness; and a second conductive material extending over the first portion of the dielectric structure, wherein an oxygen-enriched portion of the second conductive material extends along a top surface and a sidewall of the second conductive material has an oxygen concentration which is larger than an oxygen concentration of a bottom surface and an interior portion of the second conductive material. In some embodiments, the semiconductor device further includes a protection layer extending over a top surface of the first portion of the dielectric structure, a top surface of the third portion of the dielectric structure, and over the oxygen-enriched portion of the second conductive material. In some embodiments, the dielectric structure further comprises an oxygen-enriched silicon nitride layer extending over a top surface of the first portion, the second portion, and the third portion of the dielectric structure. In some embodiments, the device further comprising a cap layer extending over the dielectric structure and the second conductive material. In some embodiments, the first thickness is smaller than the second thickness. In some embodiments, the dielectric structure comprises at least two layers of dielectric material. In some embodiments, the dielectric structure comprises alternating layers of silicon nitride and oxygen-enriched silicon nitride. In some embodiments, wherein the dielectric structure further comprises a first layer of oxygen-enriched silicon nitride in direct contact with the first conductive material, and a second layer of oxygen-enriched silicon nitride in direct contact with the bottom surface of the second conductive material. In some embodiments, the protection layer further comprises an oxide layer, a silicon nitride layer, or a doped silicon oxynitride layer.

Aspects of the present disclosure relate to a method of making a semiconductor device, which includes operations for manufacturing a first capacitor electrode; manufacturing a dielectric structure by depositing at least one layer of dielectric material, wherein the dielectric structure comprises a first portion with a first thickness, and a second portion with a second thickness smaller than the first thickness, and a third portion between the first portion and the second portion, wherein the third portion has an angled sidewall extending from the first portion to the second portion; depositing a layer of a second conductive material over the dielectric structure; manufacturing a second capacitor electrode by etching the second conductive material to expose the first portion of the dielectric structure; enriching an exposed portion of the second capacitor electrode with oxygen; and depositing a protection layer over the second capacitor electrode and the first portion of the dielectric structure. In some embodiments, the method further includes depositing a cap layer over the protection layer. In some embodiments, manufacturing a dielectric structure further comprises depositing alternating layers of a first dielectric material and a second dielectric material different from the first dielectric material. In some embodiments, the method includes operations for trimming the at least one layer of dielectric material to form a dielectric material base and a dielectric material pillar. In some embodiments, the method includes operations for manufacturing a hardmask over a top surface of the protection layer directly over the dielectric material pillar of the dielectric structure. In some embodiments, the method includes steps for depositing a cap layer directly over the dielectric material pillar and the hardmask.

Aspects of the present disclosure relate to a semiconductor device, which includes a capacitor having a base region and a pillar region, wherein a top surface of the base region extends beyond a sidewall of the pillar region, and the capacitor further includes: a first electrode in the base region; a second electrode in the pillar region, the second electrode having an oxygen-enriched layer along sidewalls and a top surface of the second electrode; a first portion of dielectric material in the base region wherein the first portion of dielectric material extends along a top surface of the first electrode; a second portion of dielectric material in the pillar region, wherein a top surface of the second portion of dielectric material extends along a bottom surface of the second electrode; and a protection layer extending over the oxygen-enriched layer of the second electrode. In some embodiments, the oxygen-enriched layer of the second electrode has a sidewall with a sidewall angle greater than 90°. In some embodiments, the semiconductor device includes a hardmask extending over the protection layer in the pillar region; and a cap layer extending over a top surface of the hardmask and the protection layer along sidewalls of the second electrode, the second portion of dielectric material in the pillar region, and the top surface of the first portion of dielectric material in the base region. In some embodiments, the first electrode and the second electrode comprise tantalum nitride. In some embodiments, the first electrode comprises a first electrode material and the second electrode comprises a second electrode material different from the first electrode material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive material;
a dielectric structure extending over a top surface of the first conductive material, the dielectric structure having a first portion with a first thickness, and a second portion with a second thickness, and a third portion with a third thickness between the first thickness and the second thickness;
a second conductive material extending over the second portion of the dielectric structure, wherein an oxygen-enriched portion of the second conductive material extends along a top surface and a sidewall of the second conductive material, and has an oxygen concentration which is larger than an oxygen concentration of a bottom surface and an interior portion of the second conductive material; and
a protection layer extending over a top surface of the first portion of the dielectric structure, a top surface of the third portion of the dielectric structure, and over the oxygen-enriched portion of the second conductive material, wherein the dielectric structure further comprises an oxygen-enriched silicon nitride layer extending over a top surface of the first portion, the second portion, and the third portion of the dielectric structure.

2. The semiconductor device of claim 1, further comprising a cap layer extending over the dielectric structure and the second conductive material.

3. The semiconductor device of claim 1, wherein the first thickness is smaller than the second thickness.

4. The semiconductor device of claim 1, wherein the dielectric structure comprises at least two layers of dielectric material.

5. The semiconductor device of claim 1, wherein the dielectric structure comprises alternating layers of silicon nitride and oxygen-enriched silicon nitride.

6. The semiconductor device of claim 5, wherein the dielectric structure further comprises a first layer of oxygen-enriched silicon nitride in direct contact with the first conductive material, and the oxygen-enriched silicon nitride layer in direct contact with the bottom surface of the second conductive material.

7. The semiconductor device of claim 1, wherein the protection layer further comprises an oxide layer, a silicon nitride layer, or a doped silicon oxynitride layer.

8. The semiconductor device of claim 1, wherein a thickness of the protection layer ranges from 5 angstroms to 395 angstroms.

9. A semiconductor device, comprising:
a capacitor having a base region and a pillar region, wherein a top surface of the base region extends beyond a sidewall of the pillar region, and the capacitor further comprises:
a first electrode in the base region;
a second electrode in the pillar region, the second electrode having an oxygen-enriched layer along sidewalls and a top surface of the second electrode, wherein the oxygen-enriched layer of the second electrode has a sidewall with a sidewall angle greater than 90°;
a first portion of dielectric material in the base region wherein the first portion of dielectric material extends along a top surface of the first electrode;
a second portion of dielectric material in the pillar region, wherein a top surface of the second portion of dielectric material extends along a bottom surface of the second electrode;
a protection layer extending over the oxygen-enriched layer of the second electrode;
a hardmask extending over the protection layer in the pillar region; and
a cap layer extending over a top surface of the hardmask and the protection layer along sidewalls of the second electrode, the second portion of dielectric material in the pillar region, and the top surface of the first portion of dielectric material in the base region.

10. The semiconductor device of claim 9, wherein the first electrode and the second electrode comprise tantalum nitride.

11. The semiconductor device of claim 9, wherein the first electrode comprises a first electrode material and the second electrode comprises a second electrode material different from the first electrode material.

12. The semiconductor device of claim 9, wherein a thickness of the hardmask ranges from 20 nanometers (nm) to 200 nm.

13. A semiconductor device, comprising:
a first electrode;
a dielectric structure over the first electrode, wherein the dielectric structure has a peripheral region having a first thickness, and the dielectric structure has a central region having a second thickness greater than the first thickness;
a second electrode over the central region of the dielectric structure, wherein the second electrode has a variable oxygen concentration in a thickness direction;
a protection layer over the second electrode;
a hardmask extending over the protection layer; and
a cap layer extending over a top surface of the hardmask and the protection layer along sidewalls of the second electrode, the peripheral region of the dielectric structure, and the central region of the dielectric structure.

14. The semiconductor device of claim 13, wherein a first oxygen concentration of the second electrode adjacent to the dielectric structure is less than a second oxygen concentration of the second electrode distal from the dielectric structure.

15. The semiconductor device of claim 13, wherein the first electrode comprises a plurality of conductive layers.

16. The semiconductor device of claim 13, wherein the second thickness is a variable thickness.

17. The semiconductor device of claim 13, wherein the second electrode has a variable thickness.

18. The semiconductor device of claim 13, wherein an angle between a top surface of the peripheral region of the dielectric structure and a sidewall of the central region of the dielectric structure is greater than 90-degrees.

19. The semiconductor device of claim 13, wherein a thickness of the protection layer ranges from 5 angstroms to 395 angstroms.

20. The semiconductor device of claim 13, wherein a thickness of the hardmask ranges from 20 nanometers (nm) to 200 nm.

* * * * *